United States Patent
Wang et al.

(10) Patent No.: US 12,553,823 B2
(45) Date of Patent: Feb. 17, 2026

(54) SYSTEM AND METHOD OF MONITORING PRECURSOR TANK

(71) Applicant: TAIWAN SEMICONDUCTOR MANUFACTURING COMPANY, LTD., Hsinchu (TW)

(72) Inventors: Chia-Hsi Wang, Changhua County (TW); Yen-Yu Chen, Taichung (TW); Jui-Mu Cho, Hsinchu County (TW); Chung Hsien Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 286 days.

(21) Appl. No.: 18/134,997

(22) Filed: Apr. 14, 2023

(65) Prior Publication Data
US 2024/0344976 A1    Oct. 17, 2024

(51) Int. Cl.
*G01N 21/3504* (2014.01)
*H01L 21/66* (2006.01)
*H01L 21/67* (2006.01)

(52) U.S. Cl.
CPC ... *G01N 21/3504* (2013.01); *H01L 21/67253* (2013.01); *H01L 22/26* (2013.01)

(58) Field of Classification Search
None
See application file for complete search history.

(56) References Cited

U.S. PATENT DOCUMENTS

| | | | |
|---|---|---|---|
| 10,685,819 B2 | 6/2020 | Gopalan et al. | |
| 11,287,371 B2 | 3/2022 | Shie et al. | |
| 2004/0015300 A1* | 1/2004 | Ganguli | C23C 16/52 702/24 |
| 2020/0041407 A1 | 2/2020 | Huang et al. | |

FOREIGN PATENT DOCUMENTS

| | | |
|---|---|---|
| TW | 201907150 A | 2/2019 |
| TW | 202122779 A | 6/2021 |

* cited by examiner

*Primary Examiner* — Edwin C Gunberg
(74) *Attorney, Agent, or Firm* — STUDEBAKER BRACKETT PLLC

(57) ABSTRACT

A system for monitoring a precursor tank during a deposition process includes a sensor and a signal processor. The sensor includes a sensor chamber connected in line with the precursor tank and a deposition chamber, a radiation emitter to emit a radiation passing through a precursor-containing gas in the sensor chamber, and a radiation receiver to receive the radiation passed through the precursor-containing gas. The signal processor obtains an absorption spectrum of the precursor-containing gas from the received radiation and determines a remaining precursor amount in the precursor tank based on the absorption spectrum. The system facilitates inline monitoring the remaining precursor amount in the precursor tank during a deposition operation, thereby advantageously reducing risks of undergoing a deposition operation while the remaining precursor amount is unacceptably low and avoiding replacing the precursor tank while the remaining precursor amount is acceptable.

20 Claims, 11 Drawing Sheets

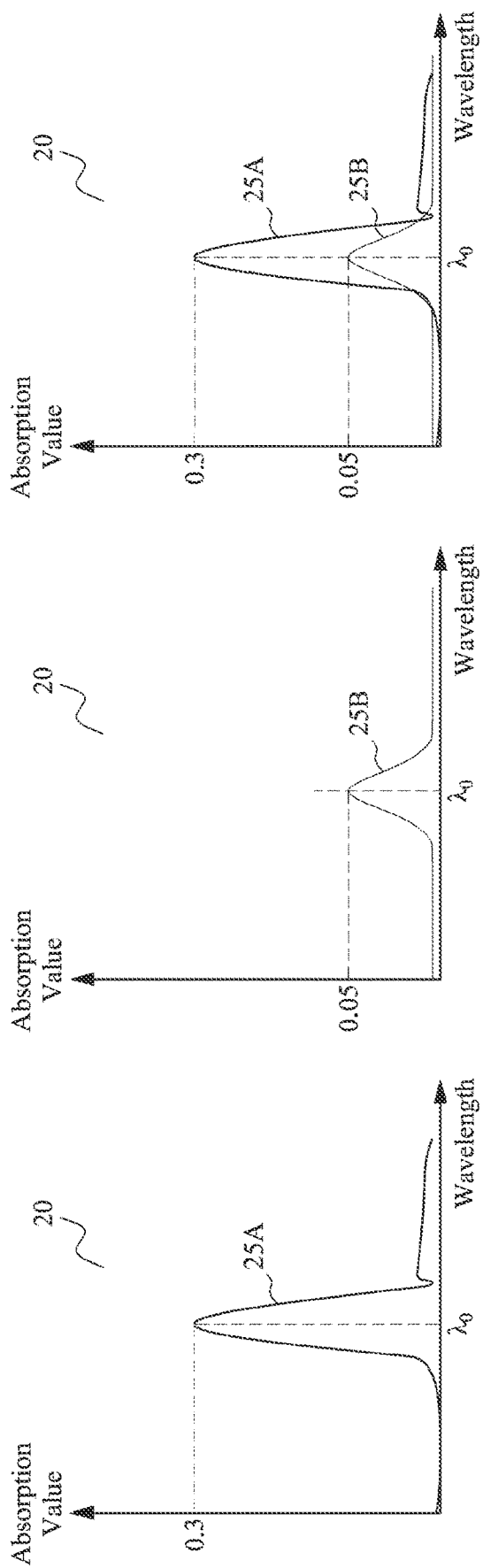

SYSTEM AND METHOD OF MONITORING PRECURSOR TANK

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology in the manufacturing processes of semiconductor devices is a Chemical vapor deposition (CVD) technique that is designed to deposit high-performance solid materials used in semiconductor processing. Atomic layer deposition (ALD) is another thin film deposition technique that uses precursors (chemicals) to react with the surface separately in a sequential manner. However, there have been challenges in automatic and precise control of CVD or ALD processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a spectrum plot of absorption versus wavelength corresponding to a remaining precursor amount in a precursor tank in accordance with some embodiments.

FIG. 5B is a spectrum plot of absorption versus wavelength corresponding to another remaining precursor amount in the precursor tank in accordance with some embodiments.

FIG. 5C illustrates a comparison of two spectrum plots of absorption versus wavelength respectively corresponding to different remaining precursor amounts in the precursor tank in accordance with some embodiments.

DETAILED DESCRIPTION

Figure 1A:
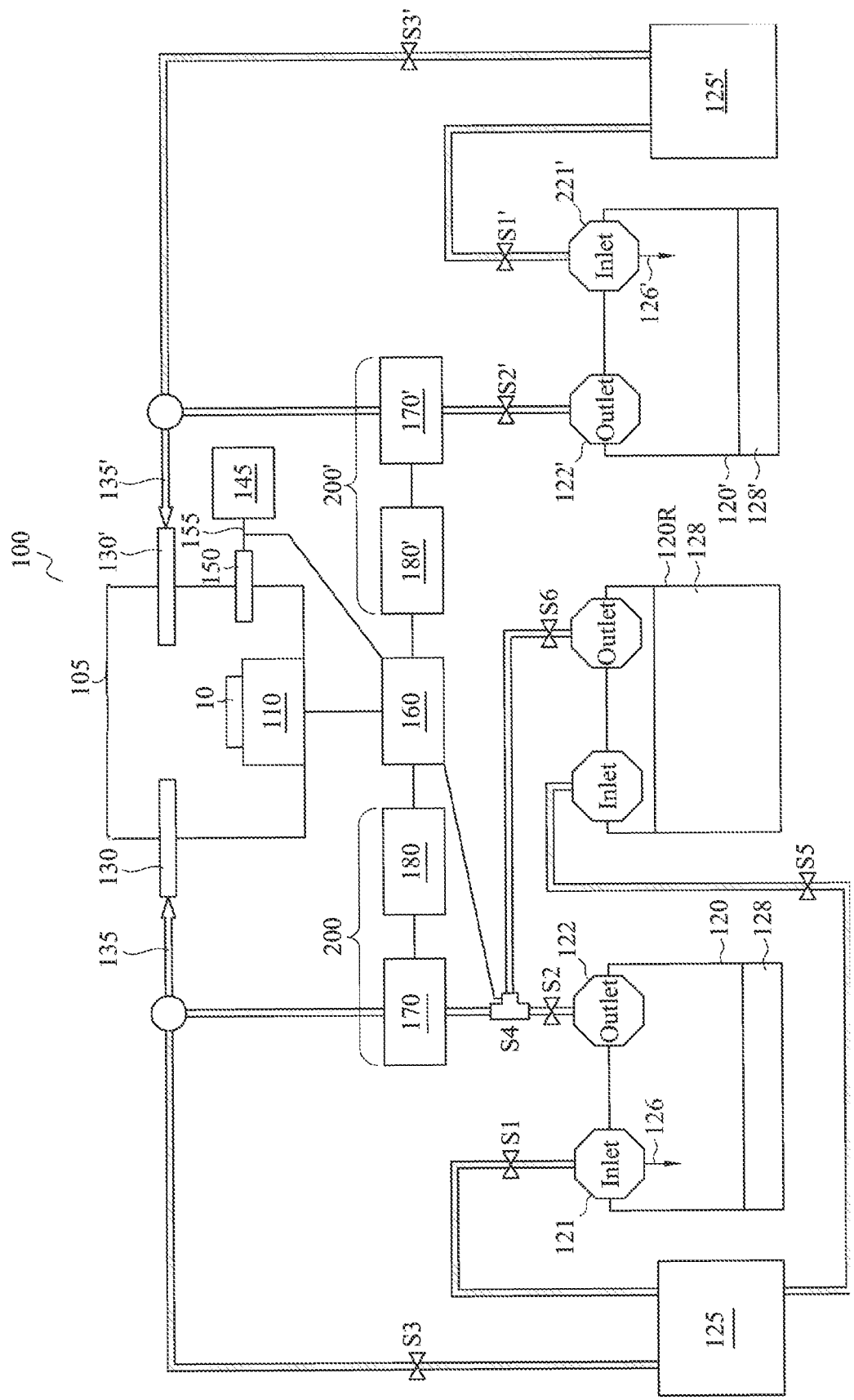
FIG. 1A is a schematic view of a deposition system in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below." "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

The present disclosure generally relates to a system and a method for monitoring a remaining precursor amount in a precursor tank during a deposition operation. More particularly, the system and the method described herein facilitate inline monitoring a remaining precursor amount in a precursor tank during a vapor deposition operation (such as a CVD or an ALD operation).

In some embodiments, a gas sensor is used for monitoring a remaining precursor amount in a precursor tank. The gas sensor includes a sensor chamber, a radiation emitter, a radiation receiver, and a signal processor. The sensor chamber is connected in line with a precursor tank and a deposition chamber. The radiation emitter emits a radiation passing through a precursor containing gas supplied from the precursor tank. The radiation receiver receives the radiation. The signal processor obtains a spectrum of the received radiation, and determines a remaining precursor amount in the precursor tank based on the obtained spectrum.

The monitoring system and method described herein facilitate accurately inline monitoring a remaining precursor amount in a precursor tank during a CVD or an ALD operation, thereby advantageously reducing risks of undergoing a CVD or an ALD operation while a remaining precursor amount in the precursor tank is unacceptably low, and saving costs without replacing the precursor tank while the remaining precursor amount in the precursor tank is still acceptable.

FIG. 1A is a schematic view of a deposition system 100 in accordance with some embodiments. In some embodiments, a layer (such as a dielectric layer, a conductive layer, a semiconductor layer or a photoresist composition) is deposited by performing a vapor phase deposition operation. In some embodiments, a vapor phase deposition operation includes a CVD or an ALD operation. In some embodiments, the CVD includes plasma-enhanced chemical vapor deposition (PE-CVD), metal-organic chemical vapor deposition (MO-CVD), atmospheric pressure chemical vapor deposition (AP-CVD), and low pressure chemical vapor deposition (LP-CVD). In some embodiments, the ALD includes plasma-enhanced atomic layer deposition (PE-ALD).

In some embodiments, as shown in FIG. 1A, the deposition system 100 includes a CVD or an ALD apparatus that includes a deposition chamber 105 having one or more inlets 130 and 130', and one or more outlets 150. A substrate support stage 110 in the deposition chamber 105 supports a substrate 10, such as a silicon wafer. In some embodiments, the substrate support stage 110 includes a heater (not shown).

In some embodiments, a first precursor or compound gas supply 120 for supplying a first precursor 128 (e.g., organometallic compounds, such as pentakis-dimethylamino tantalum (PDMAT)), and a carrier/purge gas supply 125 for supplying a carrier gas 126 (such as Ar gas) are connected to the inlet 130 in the deposition chamber 105 via a gas line 135. In some embodiments, a second precursor or compound gas supply 120' for supplying a second precursor 128' (e.g., $NH_3$) and a carrier/purge gas supply 125 for supplying a carrier gas 126 (such as Ar gas) are connected to another inlet 130' in the vacuum deposition chamber 105 via another gas line 135'.

In some embodiments, the deposition chamber 105 is evacuated, and excess reactants and reaction byproducts are removed by a vacuum pump 145 via the outlet 150 and exhaust line 155. In some embodiments, the flow rate or pulses of precursor gases and carrier/purge gases, evacuation of excess reactants and reaction byproducts, pressure inside the vacuum deposition chamber 105, and temperature of the vacuum deposition chamber 105 or wafer support stage 110 are controlled by a process controller 160 configured to control each of these parameters.

Depositing a layer using an ALD process includes combining the first precursor 128 and the second precursor 128' in a vapor state to form a deposition composition. In some embodiments, the first compound or first precursor 128 and the second compound or second precursor 128' are introduced into the deposition chamber 105 (such as an ALD chamber) in an alternating manner via the inlets 130 and 130', i.e., a first compound or precursor then a second compound or precursor, and then subsequently alternately repeating the introduction of the one compound or precursor followed by the second compound or precursor.

In some embodiments, the deposition chamber temperature in the deposition chamber 105 is in a range from about 30° C. to about 400° C. during the deposition operation, and is in a range from about 50° C. to about 250° C. during the deposition operation in other embodiments. In some embodiments, the pressure in the deposition chamber is in a range from about 5 mTorr to about 100 Torr during the deposition operation, and is in a range from about 100 mTorr to about 10 Torr during the deposition operation in other embodiments. In some embodiments, the flow rate of the first compound or precursor 128 and the second compound or precursor 128' is in a range from about 100 sccm to about 1000 sccm, and is in a range from about 300 sccm to about 700 sccm. In some embodiments, the ratio of the flow of the first precursor 128 (e.g., an organometallic compound precursor) to the second precursor 128' is in a range from about 1:1 to about 1:5, and is in a range from about 1:2 to about 1:4 in other embodiments. At operating parameters outside the above-recited ranges, unsatisfactory deposition layers result in some embodiments.

In some embodiments, a CVD process is used to deposit a deposition layer, and two or more gas streams, in separate inlet paths 130, 135 and 130', 135', of a first precursor 128 and a second precursor 128' are introduced to the deposition chamber 105 of a CVD apparatus, where they mix and react in the gas phase, to form a reaction product. In some embodiments, the first precursor 128 and the second precursor 128' of the deposition composition are introduced into the deposition chamber 105 (such as a CVD chamber) at about the same time via the inlets 130 and 130'. The streams are introduced using separate injection inlets 130, 130' or a dual-plenum showerhead in some embodiments. The CVD deposition apparatus is configured so that the streams of organometallic precursor 128 and second precursor 128' are mixed in the chamber, allowing the first precursor 128 (e.g., PDMAT) and the second precursor 128' (e.g., $NH_3$) to react to form a reaction product (e.g., TaN). Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit various thin deposition layers. During the ALD process, a layer is grown on a substrate 10 by exposing the surface of the substrate to alternately-provided gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor, such as PDMAT, as a first precursor 128 is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 145 and/or by a flowing an inert purge gas in some embodiments. A valve S3 is used to control the flow of the inert purge gas. Then, a second precursor 128', such as ammonia ($NH_3$), is pulsed to the deposition chamber in some embodiments. The $NH_3$ reacts with the organometallic precursor on the substrate to obtain a reaction product photoresist on the substrate surface. The second precursor 128' also forms self-saturating bonds with the underlying reactive species to provide another self-limiting and saturating second half reaction. A second purge is performed to remove unused reactants and the reaction by-products in some embodiments. Another valve S3' is used to control the flow of the inert purge gas in the second purge. Pulses of the first precursor 128 and second precursor 128' are alternated with intervening purge operations until a desired thickness of the deposition layer is achieved.

In some embodiments, the first and second precursors or compounds 128 and 128' are delivered into the deposition chamber 105 with carrier gases 126 and 126', respectively. The carrier gas, a purge gas, a deposition gas, or other process gases may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, suitable metals include tantalum (Ta), titanium (Ti), zirconium (Zr), hafnium (Hf), vanadium (V), cobalt (Co), molybdenum (Mo), tungsten (W), aluminum (Al), gallium (Ga), yttrium (Y), lanthanum (La), cerium (Ce), lutetium (Lu), or combinations thereof.

In some embodiments, the deposition system 100 also includes a first replacement precursor tank 120R containing a full amount (e.g., 100%) of the first precursor 128. The function and structure of the first replacement precursor tank 120R is the same as or similar to the function and structure of the first precursor tank 120. The first replacement precursor tank 120R is capable of being switched on via a controllable valve S4, thereby being connected to the gas sensor 170. In some embodiments, when the remaining precursor amount of the first precursor 128 in the first precursor tank 120 is detected dropped to a level the same as or below a threshold value (e.g., 5%), the process controller 160 activates one or more actions. In some embodiments, the one or more actions include automatically stopping the deposition operation, sealing the first precursor tank 120 by the valve S2, and/or switching on the first replacement precursor tank 120R via the valve S4 such that the first replacement precursor tank 120R is connected in line with the deposition chamber 105 via the gas sensor 170.

Figure 1B:
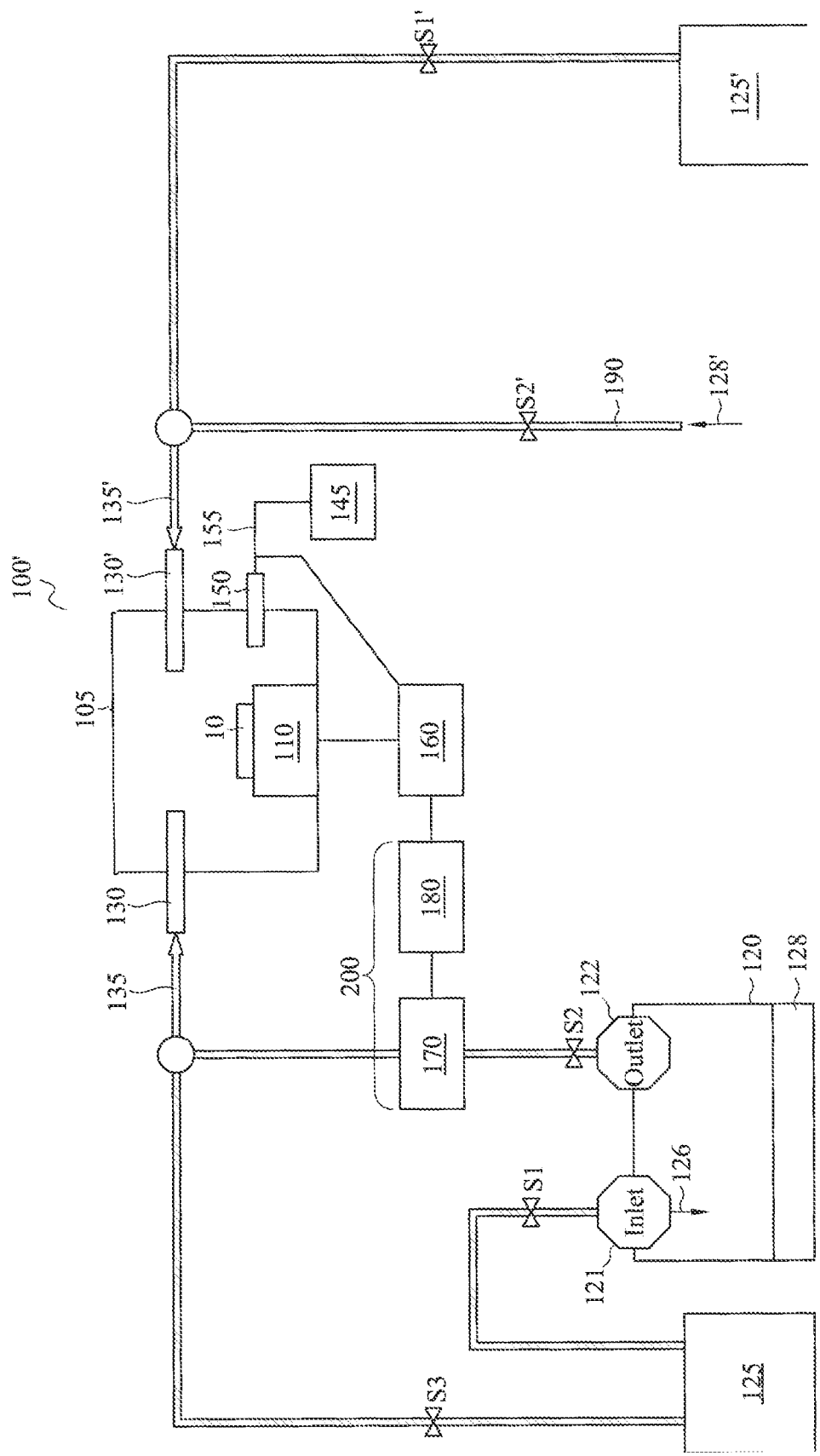
FIG. 1B is a schematic view of a deposition system in accordance with other embodiments of the present disclosure.

FIG. 1B is a schematic view of a deposition system 100' in accordance with another embodiment of the present disclosure. The functions and structures of the deposition system 100' is similar to the deposition system 100 as shown in FIG. 1A. However, different from the deposition system 100 that uses two precursor tanks 120 and 120', the deposition system 100' uses a single precursor tank 120 to supply the first precursor 128, and uses another source (rather than a precursor tank) to supply the second precursor 128'. In some embodiments, the deposition system 100' includes a single precursor tank 120 for containing a first precursor 128 (e.g., HfCl4), a single gas sensor 170, and a single signal processor 180. The single gas sensor 170 is connected in line between the precursor tank 120 and the deposition chamber 105. In some embodiments, a gaseous second precursor 128' (e.g., vaporized water $H_2O$) is supplied from a precursor source (not shown in the figures) of the second precursor 128' through a precursor line 190. As shown in FIG. 1B, the gaseous second precursor 128' further passes through a gas line 135' and enters the deposition chamber 105 via an inlet 130'. There is no gas sensor connected between the precursor source of the second precursor 128' and the deposition chamber 105. In some embodiments, in an ALD operation, gaseous HfCl4 is used as the first precursor 128, vaporized $H_2O$ is used as the second precursor 128', the reaction product is $HfO_2$, and thus various layers of reaction product $HfO_2$ are deposited by the ALD operation. In some embodiments, valve S2' is used to control a flow of the gaseous second precursor 128', and valve S3' is used to control a flow of a carrier or purge gas (e.g., Ar gas) 126'.

Figure 2:
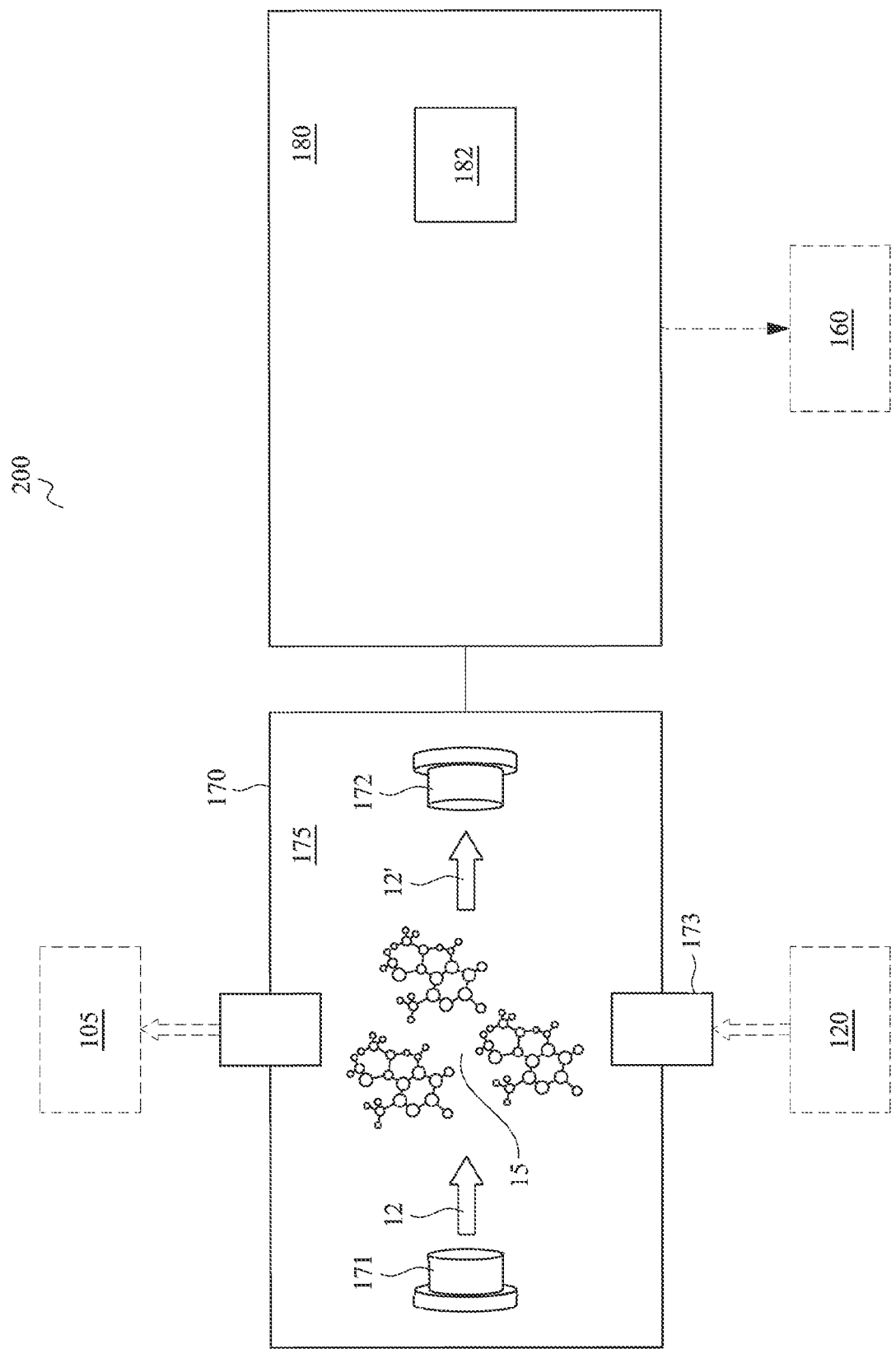
FIG. 2 is a schematic view of a system of monitoring a remaining precursor amount in a precursor tank during a deposition operation in accordance with some embodiments.

FIG. 2 is a schematic view of a system 200 for monitoring a remaining precursor amount of a precursor 128 in a precursor tank 120 during a deposition operation in accordance with some embodiments. The deposition operation includes a CVD operation in some embodiments, and the deposition operation includes an ALD operation in other embodiments.

As shown in FIGS. 1A and 2 for example, the monitoring system 200 includes a gas sensor 170 and a signal processor 180. In some embodiments, the gas sensor 170 is connected in line between a precursor tank 120 and a deposition chamber 105. In some embodiments, the precursor tank 120 contains a first precursor 128 (such as PDMAT). The monitoring system 200 is configured to monitor a remaining precursor amount of the first precursor 128 in the precursor tank 120 during a deposition operation.

Similar to the monitoring system 200 (as shown in FIG. 2 and FIG. 1A), referring to FIG. 1A, another monitor system 200' for monitoring a deposition operation similarly includes another gas sensor 170' and another signal processor 180'. The other gas sensor 170' is connected in line with another precursor tank 120' and the deposition chamber 105. The other precursor tank 120' contains a second precursor 128' (such as $HfCl_4$). The other monitoring system 200' is configured to monitor a remaining precursor amount of the second precursor 128' in the other precursor tank 120' during a deposition operation. The structures and functions of the other monitoring system 200' are the same as or similar to the monitoring system 200. For conciseness and briefness purpose, some descriptions and explanations are merely made to the monitoring system 200.

In some embodiments, as shown in FIG. 2, the sensor 170 of the monitoring system 200 includes a sensor chamber 175, a radiation emitter 171, and a radiation receiver 172. The sensor chamber 175 is connected in line with a precursor tank 120 via an inlet 173, and is connected in line with a deposition chamber 105 via an outlet 174. The radiation emitter 171 emits a radiation 12 passing through a precursor-containing gas 15 that is supplied from the precursor tank 120. The radiation receiver 172 received the radiation 12' that has passed through a precursor-containing gas 15. In some embodiments, the radiation 12 is an infrared radiation. The infrared wavelength of the infrared radiation 12 is in a range from about 700 nm to about 1400 nm in some embodiments, and is in a range from about 900 nm to about 1200 nm in other embodiments. In some embodiments, the radiation emitter 171 is an infrared radiation emitter, and the radiation receiver 172 is an infrared radiation receiver.

In some embodiments, the precursor-containing gas 15 is a gaseous mixture of a gaseous precursor 128 supplied from the precursor tank 120 and a carrier gas 126 supplied from the carrier gas supply 125. In some embodiments, the precursor-containing gas 15 is delivered from the precursor tank 120 to the sensor chamber 175 via an inlet 173, and is delivered from the sensor chamber 175 to a deposition chamber 105 via an outlet (174).

Figure 6:
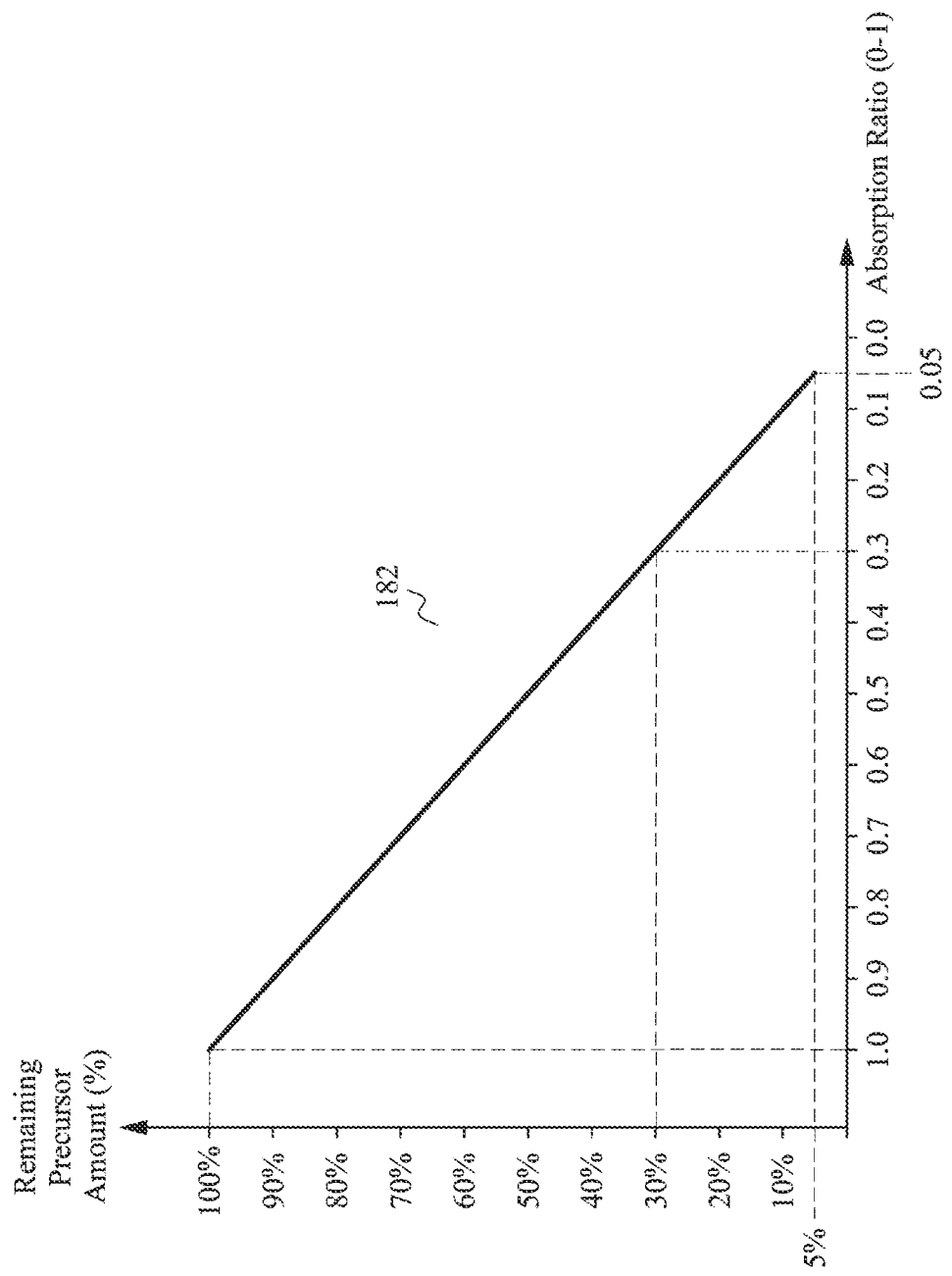
FIG. 6 shows a statistical process chart illustrating a relationship between a remaining precursor amount in a precursor tank and an absorption ratio value in accordance with an embodiment.

In some embodiments, the signal processor 180 of the monitoring system 200 obtains an absorption spectrum 20 (as shown in FIGS. 5A, 5B, and/or 5C) of the precursor-containing gas 15 from the received radiation 12', and determines a remaining precursor amount (e.g., 30%) of the precursor 128 (e.g., PDMAT) in the precursor tank 120 based on the absorption spectrum 20. In some embodiments, the signal processor 180 includes a statistical process chart (SPC) 182 (more details as shown in FIG. 6) that reflects a relationship between a remaining precursor amount (e.g., 30%) of a precursor 128 in a precursor tank 120 and an absorption value (e.g., 0.3) in accordance with an embodiment. In some embodiments, the signal processor 180 sends a warning signal 18 to a process controller 160 (as shown in FIG. 1A) upon detecting the remaining precursor amount equal to or lower than a threshold value (e.g., 5%).

Figure 3:
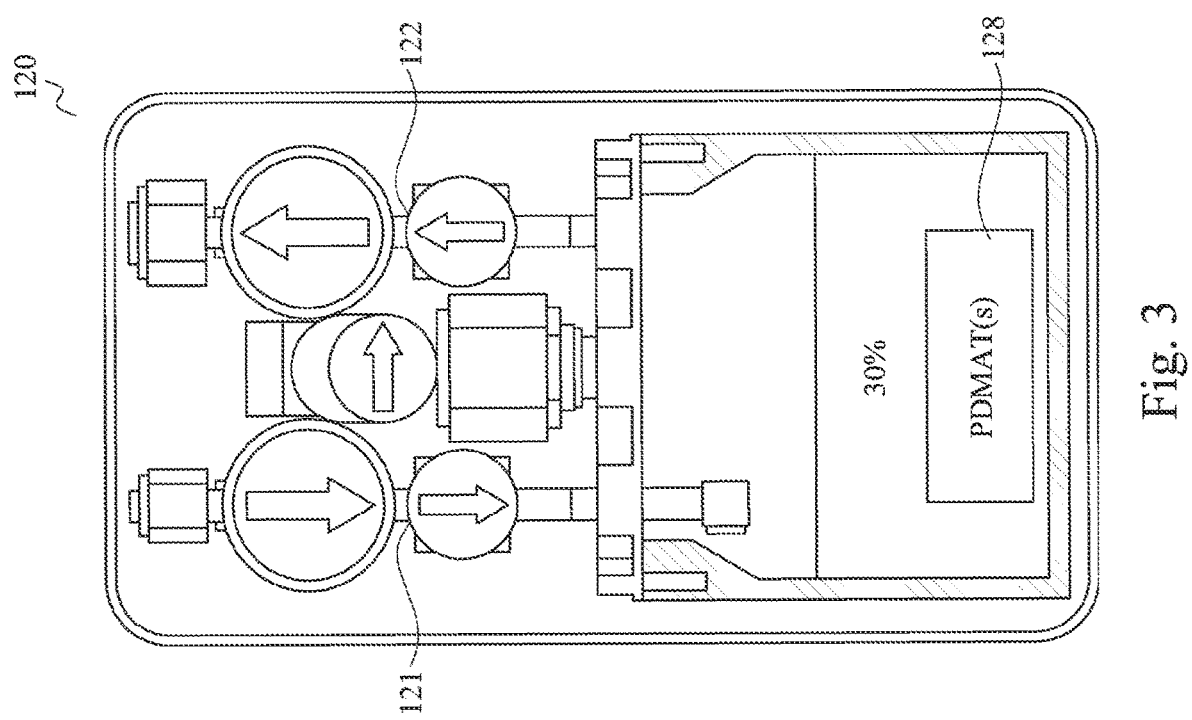
FIG. 3 is a schematic view of a precursor tank containing a precursor with a remaining precursor amount in accordance with some embodiments.

FIG. 3 is schematic view of a precursor tank 120 containing a precursor 128 (such as PDMAT) with a remaining precursor amount in accordance with some embodiments. The remaining precursor amount reduces due to the consumption and can be an amount such as 60%, 30% or 5% etc. In some embodiments, the precursor 128 in the precursor tank 120 is in a solid state. In other embodiments, the precursor 128 in the precursor tank 120 is in a liquid state.

Figure 4B:
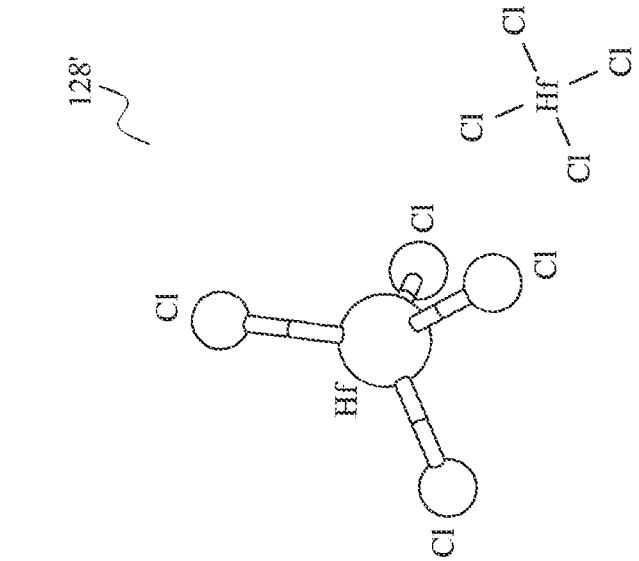
FIG. 4B is a view illustrating a molecular scheme and a molecular scheme formula of another precursor in another precursor tank in accordance with some embodiments.
Figure 4A:
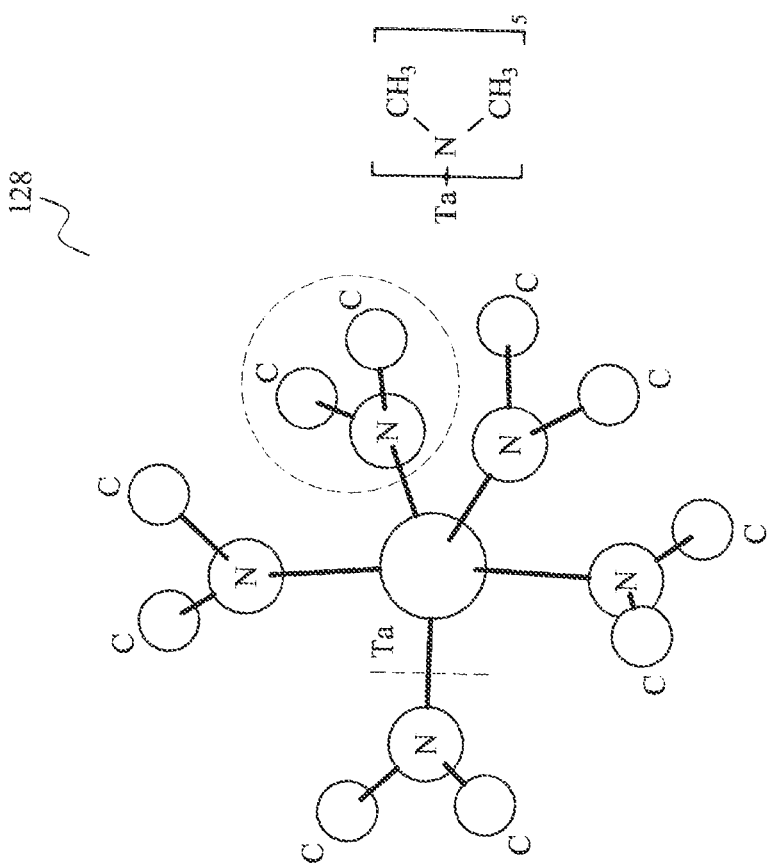
FIG. 4A is a view illustrating a molecular scheme and a molecular scheme formula of a precursor contained in a precursor tank in accordance with some embodiments.

FIG. 4A is a view illustrating a molecular scheme and a molecular formula of a first precursor (such as PDMAT) 128 that is contained in the precursor tank 120 in accordance with some embodiments. FIG. 4B is a view illustrating a molecular scheme and a molecular formula of another precursor 128' ($HfCl_4$) that is contained in another precursor tank 120' (as shown in FIG. 1A) in accordance with some embodiments. In an embodiment, in an ALD operation, the first precursor 128 is PDMAT, the second precursor is $NH_3$, and thus the reaction product is TaN. In another embodiment, in an ALD operation, the first precursor 128 is $HfCl_4$, the second precursor 128' is vaporized water $H_2O$, and thus the reaction product is $HfO_2$. However, the disclosure is not limited to these combinations of the first precursor 128 and the second precursor 128'. By an ALD operation, various layers of the reaction product are deposited on a wafer, and a total thickness of the layers of the reaction product depends on a total number of the ALD cycles.

In some embodiments, in an ALD process, a first precursor (such as PDMAT) 128 is pulsed and delivered to the substrate 10 surface in the deposition chamber 105 in a first half reaction. In some embodiments, the first precursor PDMAT 128 reacts with a suitable underlying species (for example OH or NH functionality on the surface of the substrate) to form a new self-saturating surface. Excess unused reactants and the reaction by-products are removed, by an evacuation-pump down using a vacuum pump 145 and/or by a flowing an inert purge gas in some embodiments. Then, a second precursor (such as $NH_3$) 128' is pulsed and delivered to the deposition chamber 105 in some embodiments. The second precursor $NH_3$ 128' reacts with the first precursor PDMAT 128 on the surface of the substrate 10 to obtain a reaction product (such as TaN) on the surface of the substrate 10. The second precursor $NH_3$ 128' also forms self-saturating bonds with the underlying reactive species to provide another self-limiting and saturating second half reaction. A second purge is performed to remove unused reactants and the reaction by-products in some embodiments. Pulses of the first precursor 128 and the second precursor 128' are alternated with intervening purge operations until a desired thickness of the deposition layer of reaction product is achieved. In some embodiments, the first precursor 128 is delivered into the deposition chamber 105 with a carrier gas 126 supplied from a carrier/purge gas supply 125, and the second precursor 128' is delivered into the deposition chamber 105 with another carrier gas 126' supplied from another carrier/purge gas supply 125'. The carrier gas, a purge gas, a deposition gas, or other process gases may contain nitrogen, hydrogen, argon, neon, helium, or combinations thereof.

During the CVD or ALD process, the precursor 128 in the precursor tank 120 is consumed, and thus the remaining amount of the precursor 128 in the precursor tank 120 decreases. In some embodiments, a relationship between each remaining precursor amount of a precursor 128 in a precursor tank 120 and a corresponding absorption value can be established or found through an actual measurement of the remaining precursor amount of the precursor 128 in the precursor tank 120 and a real observation of the absorption value of the absorption peak of the precursor-containing gas 15. The relationship is saved or stored in a SPC or a table in a database in some embodiments. Accordingly, monitoring the absorption peak effectively predicts or estimates the remaining amount of the precursor 128 in the precursor tank 120 during a deposition operation by using the established relationship in some embodiments. Estimating the remaining amount of the precursor 128 in the precursor tank 120 by monitoring the absorption peak is more precise and less costly than monitoring the remaining amount of the precursor in the precursor tank by, for example, measuring a weight change of the tank.

FIG. 5A is a spectrum plot 20 of absorption versus wavelength corresponding to a remaining precursor amount (e.g., 30%) of a particular precursor (e.g., PDMAT) in a precursor tank 120 in accordance with some embodiments. FIG. 5B is a spectrum plot 20 of absorption versus wavelength corresponding to a different remaining precursor amount (e.g., 5%) of the particular precursor (e.g., PDMAT) in the precursor tank 120 in accordance with some embodiments. FIG. 5C illustrates a comparison of two spectrum plots 20 of absorption versus wavelength respectively corresponding to different remaining precursor amounts (e.g., 30% and 5%) of the particular precursor (e.g., PDMAT) in the precursor tank 120 in accordance with some embodiments.

In some embodiments, the signal processor 180 obtains an absorption spectrum 20 (e.g., in FIGS. 5A and 5B) of the precursor-containing gas 15 from the received radiation 12'.

In some embodiments, as shown in FIG. 5A, an absorption value or an absorption ratio value (e.g., 0.3) is defined as a ratio of an absorption peak value 25A at the characteristic wavelength $\lambda_0$ of the precursor 128 (e.g., PDMAT) in an absorption spectrum 20 at a time $T_1$ (e.g., a current time) to an initial absorption peak value at the characteristic wavelength $\lambda_0$ of the precursor 128 in an initial absorption spectrum 20 at an initial time $T_0$ when the precursor tank 128 contains a maximum or full amount (100%) of the precursor 128.

In some embodiments, the signal processor 180 identifies an existence of the precursor 128 (e.g., PDMAT) in the precursor-containing gas 15 by an absorption peak 25 (e.g., 25A in FIG. 5A) at a characteristic wavelength $\lambda_0$ of the precursor 128 in the absorption spectrum 20 (e.g., in FIG. 5A).

In some embodiments, the signal processor 180 determines the remaining precursor amount $A_1$ (e.g., 30%) of the precursor 128 in the precursor tank 120 based on an absorption value (e.g., 0.3) at the characteristic wavelength $\lambda_0$ of the precursor 128 in the absorption spectrum 20 (e.g., in FIG. 5A) at a time $T_1$.

FIG. 6 shows a statistical process chart (SPC) 182 reflecting a relationship between a remaining precursor amount (e.g., 30%) of a particular precursor 128 (e.g., PDMAT) in a precursor tank 120 and an absorption value (e.g., 0.3) in accordance with an embodiment. Table 1 as shown below corresponds to the SPC 182 and reflects the relationship between a remaining precursor amount of a particular precursor 128 (e.g., PDMAT) in the precursor tank 120 and an absorption value or absorption ration value in accordance with an embodiment.

TABLE 1

(for precursor PDMAT):

| Absorption Ration Value (%) | Remaining Precursor Amount (0-1) |
| --- | --- |
| 100 | 1.0 |
| 90 | 0.9 |
| 80 | 0.8 |
| 70 | 0.7 |
| 60 | 0.6 |
| 50 | 0.5 |
| 40 | 0.4 |
| 30 | 0.3 |
| 20 | 0.2 |
| 10 | 0.1 |
| 5 | 0.05 |
| 0 | 0.0 |

In some embodiments, Table 1 and/or SPC 182 reflecting a relationship between a remaining precursor amount of a precursor in a precursor tank and an absorption value of a precursor-containing gas in a sensor chamber are obtained or set up through a plurality of actual measurements of remaining precursor amounts of a particular precursor (e.g., PDMAT) in a precursor tank and a plurality of direct observations of absorption values. In some embodiments, the actual measurements of the remaining precursor amounts of the precursor (e.g., PDMAT) in a precursor tank include weight measurements of the precursor tank 120 that contains the precursor 128. However, the actual measurements of the remaining precursor amounts of the precursor (e.g., PDMAT) in a precursor tank are not limited to weight measurements.

Table 1 and/or SPC 182 merely show one of a plurality of embodiments of a relationship between a remaining precursor amount of a precursor in a precursor tank and an absorption value of a precursor-containing gas in a sensor chamber. However, the disclosure is not limited to the relationship between a remaining precursor amount of a precursor in a precursor tank and an absorption value of a precursor-containing gas in a sensor chamber as shown in FIG. 6 and Table 1.

In some embodiments, each existing precursor amount value in the SPC 182 is associated with an existing absorption value in the SPC. As shown in FIG. 6 and Table 1, at the beginning while the precursor tank 120 is full of precursor 128, the existing precursor amount value is 100% and the existing absorption value is 1.0 in the SPC. The existing precursor amount value 90% in the SPC is associated with an existing absorption value 0.9 in the SPC. The existing precursor amount value 80% in the SPC is associated with an existing absorption value 0.8 in the SPC. The existing precursor amount value 70% in the SPC is associated with an existing absorption value 0.7 in the SPC. The existing precursor amount value 60% in the SPC is associated with an existing absorption value 0.6 in the SPC. The existing precursor amount value 50% in the SPC is associated with an existing absorption value 0.5 in the SPC. The existing precursor amount value 40% in the SPC is associated with an existing absorption value 0.4 in the SPC. The existing precursor amount value 30% in the SPC is associated with an existing absorption value 0.3 in the SPC. The existing precursor amount value 20% in the SPC is associated with an existing absorption value 0.2 in the SPC. The existing precursor amount value 10% in the SPC is associated with an existing absorption value 0.1 in the SPC. The existing precursor amount value 5% in the SPC is associated with an existing absorption value 0.05 in the SPC. A relationship between a remaining precursor amount of the precursor in the precursor tank and an absorption ratio value is not limited to that as shown in FIG. 6, however, the relationship between a remaining precursor amount of the precursor in the precursor tank and an absorption ratio value is not limited to that as shown in FIG. 6.

The absorption amount or value is proportional to the precursor (e.g., PDMAT) molecule amount in the precursor-containing gas (e.g., a mixture of the precursor PDMAT and a carrier gas Ar) in the sensor chamber 175 (in FIG. 2), which is proportional to an evaporated precursor molecule amount from the precursor tank 120, which is in turn proportional to a surface area of the precursor tank 120.

In some embodiments, the inner side of the precursor tank 120 is at least partially conical-shaped, and inner diameter of the precursor tank 120 decreases from the top to the bottom along the vertical axis of the precursor tank 120. In other embodiments, the inner side of the precursor tank 120 is cylinder-shaped, and inner diameter of the precursor tank 120 remains the same from the top to the bottom along the vertical axis of the precursor tank 120. However, the disclosure is not limited to a conical-shaped or cylinder-shaped precursor tank, and the precursor tank can be in other shapes.

In some embodiments, the signal processor 180 is configured to search for an existing precursor amount value in the SPC 182 using the absorption value (e.g., 0.3) at the characteristic wavelength 2% of the precursor 128 in the absorption spectrum 20, and determine or estimate the remaining precursor amount (e.g., 30%) being equal to the existing precursor amount value in the SPC 182. The SPC 182 is stored in the signal processor 180 in some embodiments, and is stored outside the signal processor 180 in other embodiments.

In some embodiments, as shown in FIG. 6, a threshold value (e.g., 5%) is set for the remaining precursor amount. The threshold value for the remaining precursor amount is in a range from about 5% to about 30% in some embodiments, and the threshold value for the remaining precursor amount is in a range from about 10% to about 25% in other embodiments. In some embodiments, two or more threshold values are set for issuing different warning signals. For example, a first threshold value can be set as 10%. Referring to FIG. 2, upon detecting the remaining precursor amount of the precursor 128 in the precursor tank 120 equal to or below the first threshold vale 10%, the signal processor 180 sends out a warning signal to indicate that the remaining precursor amount of the precursor 128 in the precursor tank 120 is low. In addition, a second threshold value can be set as 5%. Upon detecting the remaining precursor amount of the precursor 128 in the precursor tank 120 equal to or below the second threshold vale 5%, the signal processor 180 informs the processor controller 160 to replace the precursor tank 120 with a replacement precursor tank 120R containing a full amount (e.g., 100%) of precursor 128.

Figure 7:
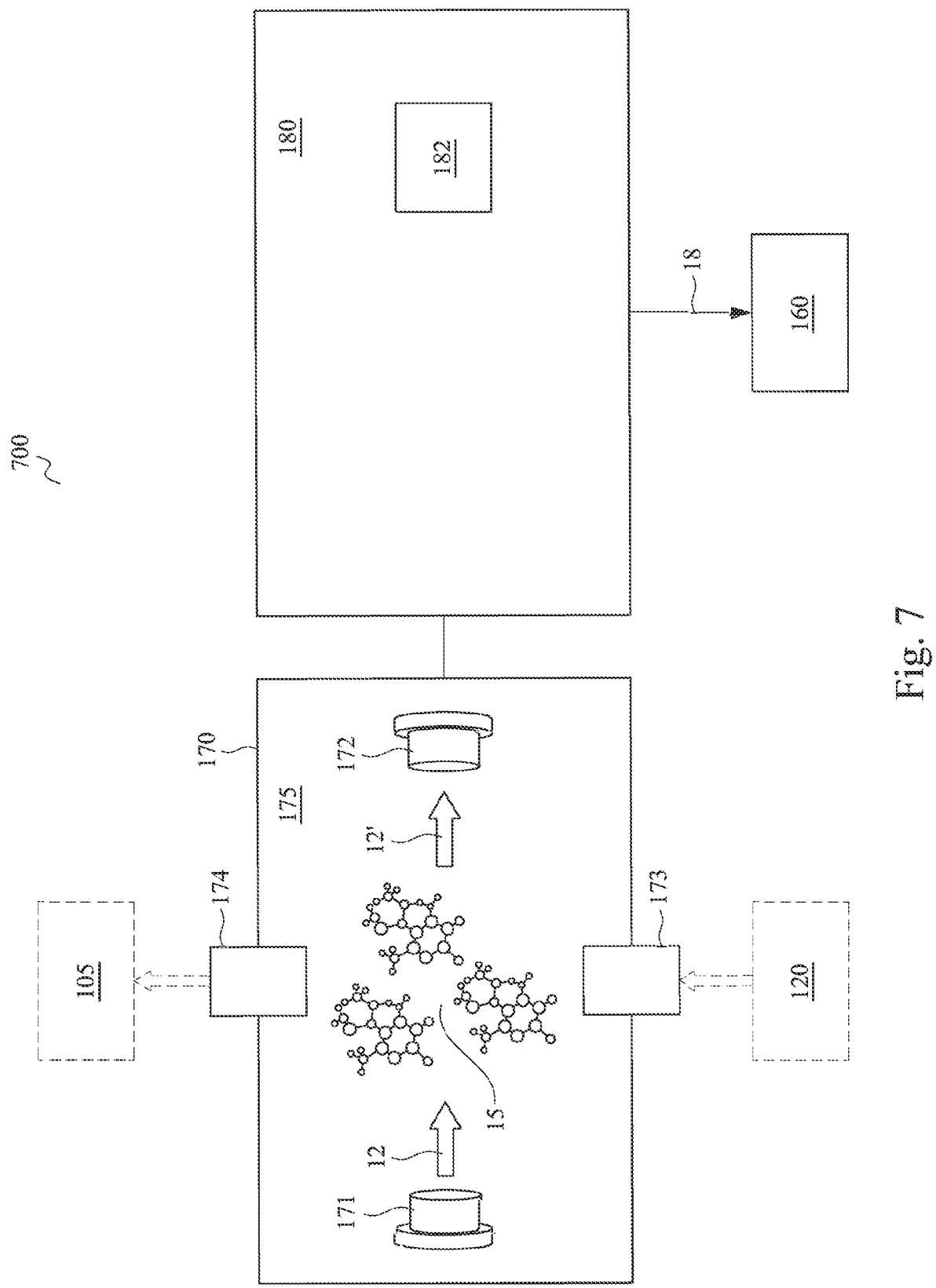
FIG. 7 is a schematic view of a system of monitoring and controlling a precursor tank in accordance with some embodiments.

FIG. 7 is a schematic view of a system 700 for monitoring and controlling a precursor tank 120 during a deposition operation in accordance with some embodiments. Referring to FIGS. 1 and 7, in some embodiments, the monitoring and controlling system 700 includes a gas sensor 170, a signal processor 180, and a process controller 160. The gas sensor 170 is connected in line with a precursor tank 120 and a deposition chamber 105. The precursor tank 120 contains a first precursor 128 (such as PDMAT). In some embodiments, the precursor 128 in the precursor tank 120 is in a solid state, and the precursor 128 in the precursor tank 120 is in a liquid state in other embodiments.

In some embodiments, as shown in FIG. 7, the sensor 170 of the monitoring and controlling system 700 includes a sensor chamber 175, a radiation emitter 171, and a radiation receiver 172. The sensor chamber 175 is connected in line with a precursor tank 120 via an inlet 173, and is connected in line with a deposition chamber 105 via an outlet 174. The radiation emitter 171 emits a radiation 12 passing through a precursor-containing gas 15 that is supplied from the precursor tank 120. The radiation receiver 172 received the radiation 12' that has passed through a precursor-containing gas 15.

In some embodiments, the system 700 is configured to monitor a remaining precursor amount (e.g., 30%) of the precursor 128 in the precursor tank 120 during a deposition operation by using the gas sensor 170 and the signal processor 180 as aforementioned. In addition, upon being informed by the signal processor 180 of the remaining precursor amount of the precursor 128 in the precursor tank 120 equal to or lower than a threshold value (e.g., 5%), the process controller 160 activates one or more actions. In some embodiments, the actions include automatically stopping the deposition operation in the deposition chamber 105, and sealing the precursor tank 120 by closing gas valves S1 and S2 as shown in FIG. 1A. In some embodiments, the actions also include switching on a spare precursor tank 120R to replace the precursor tank 120 as shown in FIG. 1A, thereby connecting the spare precursor tank 120R in line with the deposition chamber 105 via the sensor 170.

In other embodiments, another monitoring and controlling system (not specifically shown in the figures) similarly includes another gas sensor 170', another signal processor 180', and the process controller 160. The other gas sensor 170' is connected in line with another precursor tank 120' and the deposition chamber 105. The other precursor tank 120' contains a second precursor 128' (such as $HfCl_4$). The other monitoring system and controlling system configured to monitor a remaining precursor amount of the second precursor 128' in the other precursor tank 120' and controlling the other precursor tank 120'. The structures and functions of the other monitoring and controlling system are the same as or similar to the monitoring and controlling system 700. For conciseness and briefness purpose, descriptions and explanations regarding the other monitoring and controlling system are omitted.

Figure 8:
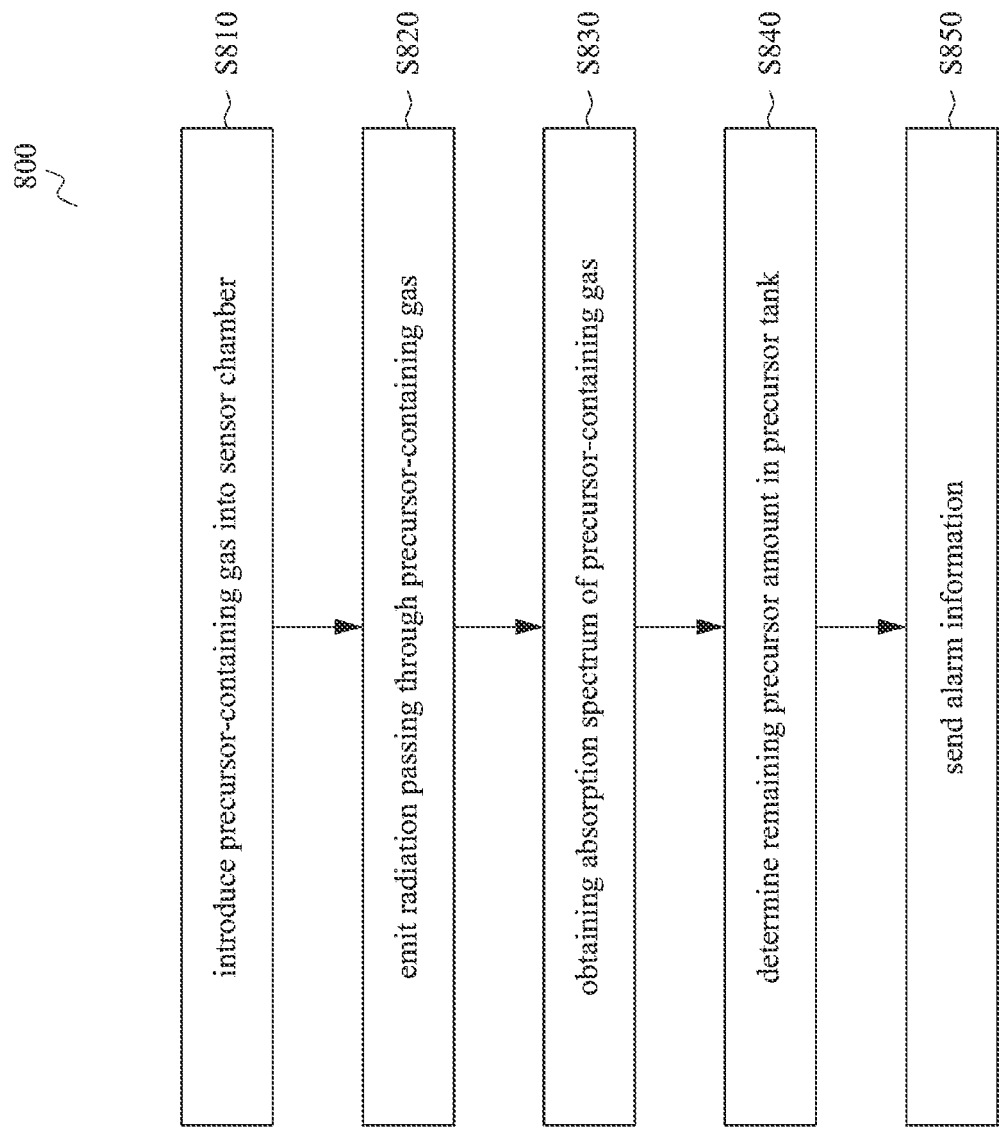
FIG. 8 is a flowchart showing a method of monitoring a precursor tank during a deposition operation in accordance with some embodiments.

FIG. 8 is a flowchart showing a method 800 of monitoring a precursor tank 120 during a deposition operation in accordance with some embodiments. In some embodiments, the deposition operation includes a CVD or an ALD operation. It is understood that additional operations can be provided before, during, and after processes discussed in FIG. 7, and some of the operations described below can be replaced or eliminated, for additional embodiments of the method. The order of the operations/processes may be interchangeable and at least some of the operations/processes may be performed in a different sequence. In some embodiments of the present disclosure, at least two or more operations/processes are performed overlapping in time, or almost simultaneously.

In some embodiments of the present disclosure, as shown in FIGS. 1A and 2, the monitoring system 200 used to monitor the precursor tank 120 includes a gas sensor 170 and a signal processor 180. In some embodiments, the gas sensor 170 is connected in line with a precursor tank 120 and a deposition chamber 105. In some embodiments, referring to FIGS. 1A and 2, the precursor tank 120 contains a first precursor 128 (such as PDMAT). In some embodiments, as shown in FIG. 2, the sensor 170 of the monitoring system 200 includes a sensor chamber 175, a radiation emitter 171, and a radiation receiver 172. The sensor chamber 175 is connected in line with the precursor tank 120 via an inlet 173, and is connected in line with a deposition chamber 105 via an outlet 174.

In some embodiments, the method 800 of monitoring a precursor tank 120 during a deposition operation includes an operation S810 of introducing a precursor-containing gas 15 into the sensor chamber 175 of the sensor 170 from the precursor tank 120.

In operation S820, a radiation 12 is emitted by the radiation emitter 171. The radiation 12 passes through a precursor-containing gas 15. The radiation 12' passed through the precursor-containing gas 15 is received by the radiation receiver 172.

In operation S830, an absorption spectrum 20 of the precursor-containing gas 15 is obtaining from the received radiation 12' by the signal processor 180.

In operation S840, a remaining precursor amount (e.g., 30%) in precursor tank is determined by the signal processor 180 based on the absorption spectrum 20. In some embodiments, the signal processor 180 determines the remaining precursor amount (e.g., 30%) of the precursor 128 in the precursor tank 120 based on an absorption value (e.g., 0.3) at a characteristic wavelength $\lambda_0$ of the absorption spectrum at a time (e.g., a current time $T_1$).

In some embodiments, the absorption value is defined as a ratio (0.3) of an absorption peak value ($P_1$) at the characteristic wavelength ($\lambda_0$) in the absorption spectrum 20 at the time ($T_1$) to an initial absorption peak value ($P_0$) at the characteristic wavelength ($\lambda_0$) in an initial absorption spectrum ($S_0$) at an initial time ($T_0$) when the precursor tank contains a full amount ($A_0$=100%) of the precursor.

In some embodiments, the signal processor 180 is configured to estimate an existing absorption spectrum associated with an existing precursor amount value in a statistical process chart (SPC) using the absorption value (e.g., 0.3), and determine the remaining precursor amount at the time ($T_1$) using the existing precursor amount value in the SPC 182. In some embodiments, each existing precursor amount value (e.g., 30%) is associated with an existing absorption value (e.g., 0.3) in the SPC 182.

In operation S850, a warning signal 18 (in FIG. 7) is sent by the signal processor 180 upon detecting the remaining precursor amount reaching or below a threshold value (e.g., 5%). In some embodiments, upon receiving the warning signal 18, a process controller 160 automatically stops the deposition operation in the deposition chamber 105 and seals the precursor tank 120. In some embodiments, upon receiving the warning signal 18, the process controller 160 automatically switches on (turns on) a spare precursor tank (not shown in the figures) to connect to the deposition chamber 105 via the sensor 170.

Figure 9A:
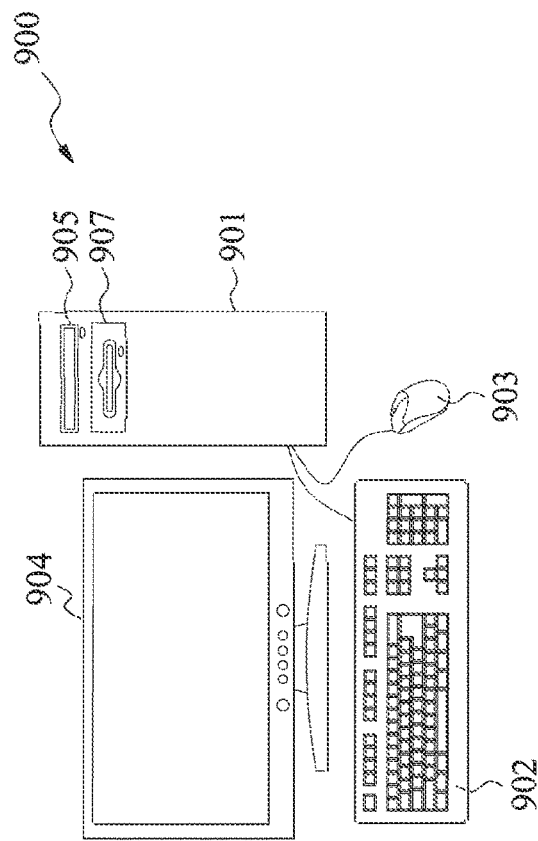
FIGS. 9A and 9B show an embodiment of a controller in accordance with some embodiments.
Figure 9B:
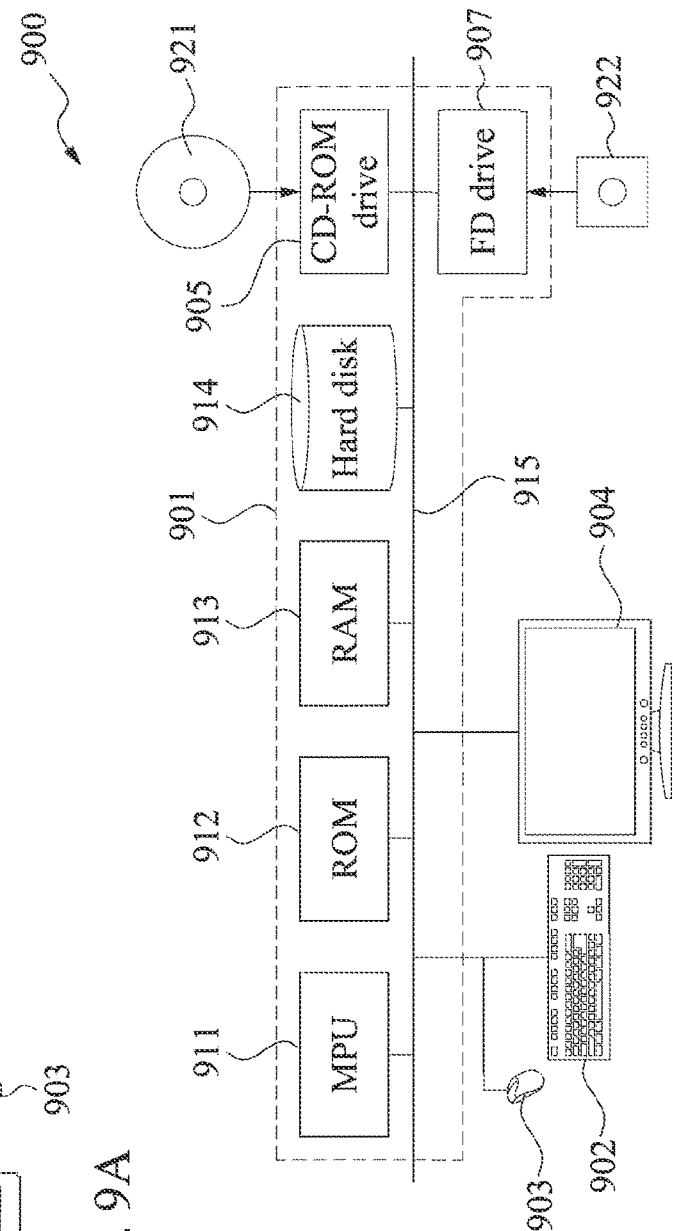

FIGS. 9A and 9B show an embodiment of a controller 900 in accordance with some embodiments. All of or a part of the methods or operations of the foregoing embodiments are realized using computer hardware and special purpose computer programs executed thereon.

In FIG. 9A, an embodiment of the controller 900 is illustrated. The controller 900 is a computer system 900 provided with a computer 901 including an optical disk read only memory (e.g., CD-ROM or DVD-ROM) drive 905 and a magnetic disk drive 907, a keyboard 902, a mouse 903, and a monitor 904 in some embodiments. At least one of the signal processor 180 or the process controller 160 of the deposition system 100 as shown in FIG. 1A is realized by the controller or the computer system 900 as shown in FIG. 9A.

FIG. 9B is a diagram showing an internal configuration of the computer system 900 in some embodiments. In FIG. 9B, the computer 901 is provided with, in addition to the optical disk drive 905 and the magnetic disk drive 907, one or more processors 911, such as a micro-processor unit (MPU); a ROM 912 in which a program such as a boot up program is stored; a random access memory (RAM) 913 connected to the processors 911 and in which a command of an application program is temporarily stored and a temporary electronic storage area is provided; a hard disk 914 in which an application program, an operating system program, and data are stored; and a data communication bus 915 that connects the processors 911, the ROM 912, and the like. The computer 901 may include a network card (not shown) for providing a connection to a computer network such as a local area network (LAN), wide area network (WAN) or any other useful computer network for communicating data used by the computing system 900.

The program for causing the computer system 900 to execute the processes for monitoring and/or controlling a deposition operation according to the embodiments disclosed herein are stored in an optical disk 921 or a magnetic disk 922, which are inserted into the optical disk drive 905 or the magnetic disk drive 907, and transmitted to the hard disk 914. Alternatively, the program may be transmitted via a network (not shown) to the computer system 900 and stored in the hard disk 914. At the time of execution, the program is loaded into the RAM 913. The program may be loaded from the optical disk 921 or the magnetic disk 922, or directly from a network. The stored programs do not necessarily have to include, for example, an operating system (OS) or a third-party program to cause the computer 901 to execute the methods disclosed herein. The program includes a command portion to call an appropriate function (module) in a controlled mode and obtain desired results in some embodiments.

Figure 10:
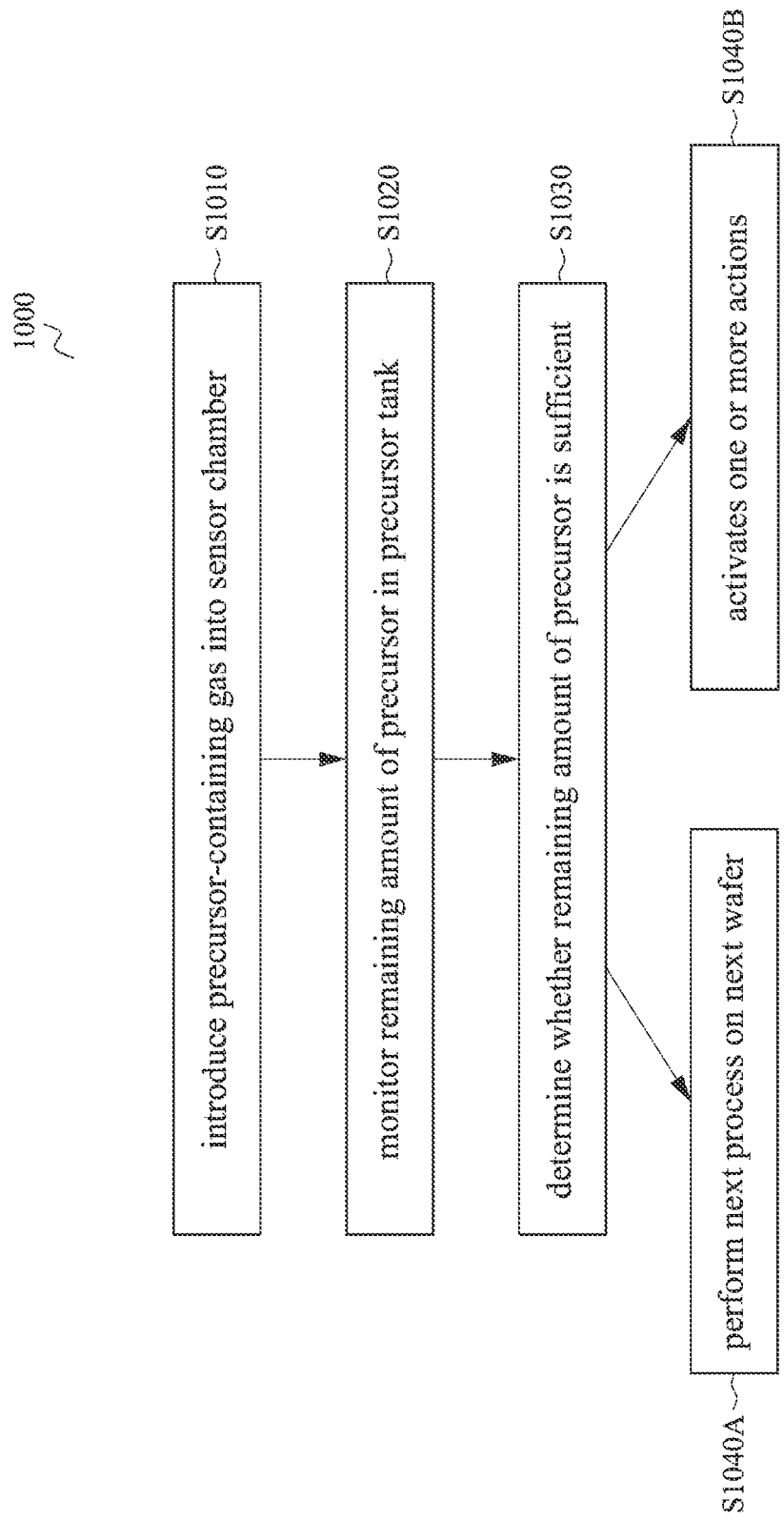
FIG. 10 is a flowchart showing a method of monitoring and controlling a precursor tank during a deposition operation in accordance with other embodiments

FIG. 10 is a flowchart showing another method 1000 of monitoring and controlling a precursor tank 120 during a deposition operation in accordance with some embodiments. As shown in FIG. 7, in some embodiments, a system 700 is used for monitoring and controlling the precursor tank 120 during a deposition operation, and includes a gas sensor 170, a signal processor 180, and a process controller 160. The gas sensor 170 is connected in line with a precursor tank 120 and a deposition chamber 105. The precursor tank 120 contains a first precursor 128 (such as PDMAT). In some embodiments, the precursor 128 in the precursor tank 120 is in a solid state, and the precursor 128 in the precursor tank 120 is in a liquid state in other embodiments. In some embodiments, the sensor 170 of the monitoring and controlling system 700 includes a sensor chamber 175, a radiation emitter 171, and a radiation receiver 172. The sensor chamber 175 is connected in line with a precursor tank 120 via an inlet 173, and is connected in line with a deposition chamber 105 via an outlet 174. The radiation emitter 171 emits a radiation 12 passing through a precursor-containing gas 15 that is supplied from the precursor tank 120. The radiation receiver 172 received the radiation 12' that has passed through a precursor-containing gas 15.

In some embodiments, a plurality of wafers are subjected to a CVD or ALD process in a wafer-by-wafer manner (i.e., processing one wafer after another). In some embodiments, the method 1000 of monitoring and controlling a precursor tank 120 during a deposition operation on a wafer (or a wafer batch) includes an operation S1010 of introducing a precursor-containing gas 15 into the sensor chamber 175 of the sensor 170 from the precursor tank 120.

In operation S1020, the system 700 monitors the remaining amount of the precursor 128 in the precursor tank 120 during a current CVD or ALD process on a current wafer (or wafer batch) and before a next CVD or ALD process on a next wafer (or wafer batch).

In operation S1030, the system 700 determines whether the remaining amount of the precursor 128 in the precursor tank 120 is sufficient to complete the process on the next wafer based on the process recipe of the next wafer and the remaining amount of the precursor 128 in the precursor tank 120. In some embodiments, the process recipe of the next wafer includes a required precursor amount for the process (e.g., CVD or ALD deposition) on the next wafer.

In operation S1040A, if the system 700 determines that the remaining precursor amount is sufficient to complete the process on the next wafer, the system 700 controls to perform the next process on the next wafer.

In operation S1040B, otherwise, if the system 700 determines that the remaining precursor amount is insufficient to complete the process on the next wafer, the system 700 activates one or more actions. In some embodiments, the one or more actions includes issuing by the system 700 an alarm and refraining by the system 700 from the process of the next wafer. In some embodiments, the one or more actions also includes automatically switching the current precursor tank 120 to a new replacement precursor tank 120R by the system 700 by changing a switching valve S4 (also see FIG. 1A) and continuing the process of the next wafer.

According to an embodiment of the present disclosure, a system for monitoring a precursor tank during a deposition process includes a gas sensor and a signal processor. The sensor includes a sensor chamber connected in line with the precursor tank and a deposition chamber, a radiation emitter to emit a radiation to pass through a precursor-containing gas in the sensor chamber, and a radiation receiver to receive the radiation passed through the precursor-containing gas. The signal processor obtains an absorption spectrum of the precursor-containing gas from the received radiation and determines a remaining precursor amount in the precursor tank based on the absorption spectrum. Upon detecting the remaining precursor amount in the precursor tank reaching or below a threshold value, the signal processor sends a warning signal to a process controller. In some embodiments, upon receiving the warning signal, the process controller activates one or more actions, which include automatically stopping the deposition operation, sealing the precursor tank, and switching on a spare precursor tank to connect to the deposition chamber via the sensor. The system thus facilitates inline monitoring the remaining precursor amount in the precursor tank during a deposition operation, thereby advantageously reducing risks of undergoing a deposition operation while the remaining precursor amount is unacceptably low and also avoiding replacing the precursor tank while the remaining precursor amount is acceptable.

In accordance with an aspect of the present disclosure, a system of monitoring a remaining precursor amount in a precursor tank during a deposition process includes a gas sensor including a sensor chamber connected in line with the precursor tank and a deposition chamber, a radiation emitter configured to emit a radiation to pass through a precursor-containing gas in the sensor chamber, and a radiation receiver configured to receive the radiation passed through the precursor-containing gas; and a signal processor configured to obtain an absorption spectrum of the precursor-containing gas from the received radiation and to determine a remaining precursor amount of a precursor in the precursor tank based on the absorption spectrum. In one or more of the foregoing and/or following embodiments, the signal processor is configured to send a warning signal to a process controller upon detecting the remaining precursor amount equal to or lower than a threshold value. In one or more of the foregoing and/or following embodiments, the precursor-containing gas is delivered from the precursor tank to the sensor chamber via an inlet, and the precursor-containing gas is delivered from the sensor chamber to the deposition chamber via an outlet. In one or more of the foregoing and/or following embodiments, the signal processor is configured to identify an existence of the precursor in the precursor-containing gas by an absorption peak at a characteristic wavelength of the precursor in the absorption spectrum. In one or more of the foregoing and/or following embodiments, the signal processor is configured to determine the remaining precursor amount in the precursor tank based on an absorption value at a characteristic wavelength in the absorption spectrum at a time. In one or more of the foregoing and/or following embodiments, the absorption value is defined as a ratio of an absorption peak value at the characteristic wavelength in the absorption spectrum at the time to an initial absorption peak value at the characteristic wavelength in an initial absorption spectrum at an initial time when the precursor tank contains a maximum or full amount of the precursor. In one or more of the foregoing and/or following embodiments, the signal processor is configured to estimate an existing precursor amount value in a statistical process chart (SPC) using the absorption value, and determine the remaining precursor amount being equal to the existing precursor amount value in the SPC, and each existing precursor amount value in the SPC is associated with an existing absorption value in the SPC.

In accordance with an aspect of the present disclosure, a system of monitoring and controlling a deposition operation, includes: a sensor including a sensor chamber connected in line with a precursor tank and a deposition chamber, a radiation emitter to emit a radiation passing through a precursor-containing gas supplied from the precursor tank, and a radiation receiver to receive the radiation; a signal processor configured to obtain an absorption spectrum of the precursor-containing gas from the received radiation, and determine a remaining precursor amount of a precursor in the precursor tank based on the absorption spectrum; and a process controller configured to activate one or more actions upon being informed by the signal processor of the remaining precursor amount equal to or lower than a threshold value. In one or more of the foregoing and/or following embodiments, the deposition operation includes a chemical vapor deposition (CVD) or an atomic layer deposition (ALD). In one or more of the foregoing and/or following embodiments, the one or more actions include automatically stopping the deposition operation, sealing the precursor tank, and switching on a spare precursor tank to connect to the deposition chamber via the sensor. In one or more of the foregoing and/or following embodiments, the precursor in the precursor tank is in solid state. In one or more of the foregoing and/or following embodiments, the precursor-containing gas includes a gaseous precursor supplied from the precursor tank and a carrier gas supplied from a carrier gas source. In one or more of the foregoing and/or following embodiments, the signal processor is configured to determine the remaining precursor amount in the precursor tank based on an absorption value at a characteristic wavelength in the absorption spectrum at a time. In one or more of the foregoing and/or following embodiments, the absorption value is defined as a ratio of an absorption peak value in the absorption spectrum at the characteristic wavelength at the time to an initial absorption peak value in an initial absorption spectrum at the characteristic wavelength at an initial time when the precursor tank contains a maximum or full amount of the precursor. In one or more of the foregoing and/or following embodiments, the signal processor is configured to estimate an existing precursor amount value in a statistical process chart (SPC) using the absorption value, and determine the remaining precursor amount being equal to the existing precursor amount value in the SPC, and each existing precursor amount value in the SPC is associated with an existing absorption value in the SPC.

In accordance with an aspect of the present disclosure, a method of monitoring a precursor tank during a deposition operation, including: introducing a precursor-containing gas into a sensor chamber of a gas sensor from the precursor tank; emitting by a radiation emitter a radiation passing through the precursor-containing gas and received by a radiation receiver; obtaining by a signal processor an absorption spectrum of the precursor-containing gas from the received radiation; determining by the signal processor a remaining precursor amount in precursor tank based on the absorption spectrum; and sending by the signal processor a warning signal upon detecting the remaining precursor amount reaching or below a threshold value. In one or more of the foregoing and/or following embodiments, upon receiving the warning signal, a process controller automatically stops the deposition operation and seals the precursor tank. In one or more of the foregoing and/or following embodiments, the signal processor determines the remaining precursor amount in the precursor tank based on an absorption value at a characteristic wavelength of the absorption spectrum at a time. In one or more of the foregoing and/or following embodiments, the absorption value is defined as a ratio of an absorption peak value at the characteristic wavelength in the absorption spectrum at the time to an initial absorption peak value at the characteristic wavelength in an initial absorption spectrum at an initial time when the precursor tank contains a full amount of the precursor. In one or more of the foregoing and/or following embodiments, the signal processor is configured to estimate an existing absorption spectrum associated with an existing precursor amount value in a statistical process chart (SPC) using the absorption value, and determine the remaining precursor amount at the time using the existing precursor amount value in the SPC, and each existing precursor amount value in the SPC is associated with an existing absorption value in the SPC.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for monitoring a precursor tank during a deposition process, comprising:
a gas sensor comprising a sensor chamber connected in line with the precursor tank and a deposition chamber, a radiation emitter configured to emit a radiation to pass through a precursor-containing gas in the sensor chamber, and a radiation receiver configured to receive the radiation passed through the precursor-containing gas; and
a signal processor configured to;
obtain an absorption spectrum $S_1$ of the precursor-containing gas from the received radiation,
determine an absorption ratio value of an absorption peak value $P_1$ of the absorption spectrum $S_1$ to an initial absorption peak value $P_0$ of an initial absorption spectrum $S_0$, and
determine a remaining precursor amount of a precursor in the precursor tank based on the absorption ratio value.

2. The system of claim 1, wherein the signal processor is configured to send a warning signal to a process controller upon detecting the remaining precursor amount equal to or lower than a threshold value.

3. The system of claim 1, wherein the precursor-containing gas is delivered from the precursor tank to the sensor chamber via an inlet, and wherein the precursor-containing gas is delivered from the sensor chamber to the deposition chamber via an outlet.

4. The system of claim 1, wherein the signal processor is configured to identify an existence of the precursor in the precursor-containing gas by the absorption peak value $P_1$ at a characteristic wavelength of the precursor in the absorption spectrum $S_1$.

5. The system of claim 1, wherein the absorption peak value $P_1$ and the initial absorption peak value $P_0$ are both determined at a characteristic wavelength, the absorption peak value $P_1$ is determined at time $T_1$, and the initial absorption peak value $P_0$ is determined at time $T_0$ before time $T_1$.

6. The system of claim 5, wherein the time $T_0$ corresponds to an initial time when the precursor tank contains a maximum or full amount of the precursor.

7. The system of claim 5, wherein the signal processor is configured to estimate an existing precursor amount value in a statistical process chart (SPC) using the absorption ratio value, and determine the remaining precursor amount being equal to the existing precursor amount value in the SPC, and wherein each existing precursor amount value in the SPC is associated with an existing absorption ratio value in the SPC.

8. A system of monitoring and controlling a deposition operation, comprising:
a sensor comprising a sensor chamber connected in line with a precursor tank and a deposition chamber, a radiation emitter to emit a radiation passing through a precursor-containing gas supplied from the precursor tank, and a radiation receiver to receive the radiation;
a signal processor configured to:
obtain an absorption spectrum $S_1$ of the precursor-containing gas from the received radiation,
determine an absorption ratio value of an absorption peak value $P_1$ of the absorption spectrum $S_1$ to an initial absorption peak value $P_0$ of an initial absorption spectrum $S_0$, and
determine a remaining precursor amount of a precursor in the precursor tank based on the absorption ratio value; and
a process controller configured to activate one or more actions upon being informed by the signal processor of the remaining precursor amount equal to or lower than a threshold value.

9. The system of claim 8, wherein the deposition operation comprises a chemical vapor deposition (CVD) or an atomic layer deposition (ALD).

10. The system of claim 8, wherein the one or more actions comprise automatically stopping the deposition operation, sealing the precursor tank, and switching on a spare precursor tank to connect to the deposition chamber via the sensor.

11. The system of claim 8, wherein the precursor in the precursor tank is in solid state.

12. The system of claim 8, wherein the precursor-containing gas comprises a gaseous precursor supplied from the precursor tank and a carrier gas supplied from a carrier gas source.

13. The system of claim 8, wherein the absorption peak value $P_1$ and the initial absorption peak value $P_0$ are both determined at a characteristic wavelength, the absorption peak value $P_1$ is determined at time $T_1$, and the initial absorption peak value $P_0$ is determined at time $T_0$ before time $T_1$.

14. The system of claim 13, wherein the time $T_0$ corresponds to an initial time when the precursor tank contains a maximum or full amount of the precursor.

15. The system of claim 13, wherein the signal processor is configured to estimate an existing precursor amount value in a statistical process chart (SPC) using the absorption ratio value, and determine the remaining precursor amount being equal to the existing precursor amount value in the SPC, and wherein each existing precursor amount value in the SPC is associated with an existing absorption ratio value in the SPC.

16. A method of monitoring a precursor tank during a deposition operation, comprising:
introducing a precursor-containing gas into a sensor chamber of a gas sensor from the precursor tank;
emitting by a radiation emitter a radiation passing through the precursor-containing gas and received by a radiation receiver;
obtaining by a signal processor an absorption spectrum $S_1$ of the precursor-containing gas from the received radiation;
determining by the signal processor an absorption ratio value of an absorption peak value $P_1$ of the absorption spectrum $S_1$ to an initial absorption peak value $P_0$ of an initial absorption spectrum $S_0$;
determining by the signal processor a remaining precursor amount of a precursor in the precursor tank based on the absorption ratio value; and
sending by the signal processor a warning signal upon detecting the remaining precursor amount reaching or below a threshold value.

17. The method of claim 16, wherein upon receiving the warning signal, a process controller automatically stops the deposition operation and seals the precursor tank.

18. The method of claim 16, wherein the absorption peak value $P_1$ and the initial absorption peak value $P_0$ are both determined at a characteristic wavelength, the absorption peak value $P_1$ is determined at time $T_1$, and the initial absorption peak value $P_0$ is determined at time $T_0$ before time $T_1$.

19. The method of claim 18, wherein the time $T_0$ corresponds to at an initial time when the precursor tank contains a full amount of the precursor.

20. The method of claim 18, wherein the signal processor is configured to estimate an existing absorption spectrum associated with an existing precursor amount value in a statistical process chart (SPC) using the absorption ratio value, and determine the remaining precursor amount at the time using the existing precursor amount value in the SPC, and wherein each existing precursor amount value in the SPC is associated with an existing absorption value in the SPC.

* * * * *